United States Patent
Khlat (10) Patent No.: US 12,265,442 B2
(45) Date of Patent: Apr. 1, 2025

(54) POWER MANAGEMENT INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 23 days.

(21) Appl. No.: 18/254,155

(22) PCT Filed: Sep. 30, 2021

(86) PCT No.: PCT/US2021/052830
§ 371 (c)(1),
(2) Date: May 23, 2023

(87) PCT Pub. No.: WO2022/119626
PCT Pub. Date: Jun. 9, 2022

(65) Prior Publication Data
US 2024/0036632 A1   Feb. 1, 2024

Related U.S. Application Data (60) Provisional application No. 63/121,622, filed on Dec. 4, 2020.

(51) Int. Cl.
G06F 1/3296     (2019.01)
(52) U.S. Cl.
CPC .................. G06F 1/3296 (2013.01)
(58) Field of Classification Search
CPC ........ G06F 1/3296; H03F 1/0227; H03F 3/19; H03F 3/21; H02M 3/155; H02M 3/18; H02M 1/009
(Continued)

(56) References Cited

U.S. PATENT DOCUMENTS 4,646,035 A * 2/1987 Chapelle ................. H03L 1/025
                                                   331/177 R
5,266,936 A * 11/1993 Saitoh .................. G09G 3/3688
                                                   345/98
(Continued)

FOREIGN PATENT DOCUMENTS

CN          103916093 A       7/2014
CN          104185953 A      12/2014
(Continued)

OTHER PUBLICATIONS

Quayle Action for U.S. Appl. No. 16/589,940, filed Dec. 4, 2020, 8 pages.
(Continued)

Primary Examiner — Paul R. Myers
(74) Attorney, Agent, or Firm — Withrow & Terranova, P.L.L.C.

(57) ABSTRACT

A power management integrated circuit (PMIC) is disclosed. The PMIC is configured to generate multiple voltages during a voltage generation period(s). In embodiments disclosed herein, the voltage generation period(s) is divided into multiple voltage generation intervals. A voltage generation circuit is configured to generate and maintain a respective one of the voltages during a respective one of the voltage generation intervals based on a reference voltage modulated for the respective one of the voltage generation intervals to thereby make the voltages concurrently available during the voltage generation period(s). Moreover, a voltage modulation circuit is configured to modulate the reference voltage in each of the voltage generation intervals based on a single direct-current to direct-current (DC-DC) power inductor. As a result, the PMIC can concurrently support multiple load circuits (e.g., power amplifiers) with significantly reduced footprint.

19 Claims, 7 Drawing Sheets

(58) Field of Classification Search
USPC .......................................................... 713/320
See application file for complete search history.

(56) References Cited

U.S. PATENT DOCUMENTS

| | | | |
|---|---|---|---|
| 5,510,753 A | 4/1996 | French | |
| 5,838,732 A | 11/1998 | Carney | |
| 6,107,862 A | 8/2000 | Mukainakano et al. | |
| 6,141,377 A | 10/2000 | Sharper et al. | |
| 6,141,541 A | 10/2000 | Midya et al. | |
| 6,411,531 B1 | 6/2002 | Nork et al. | |
| 6,985,033 B1 | 1/2006 | Shirali et al. | |
| 7,043,213 B2 | 5/2006 | Robinson et al. | |
| 7,193,467 B2 | 3/2007 | Garlepp et al. | |
| 7,471,155 B1 | 12/2008 | Levesque | |
| 7,570,931 B2 | 8/2009 | McCallister et al. | |
| 7,994,862 B1 | 8/2011 | Pukhovski | |
| 8,461,928 B2 | 6/2013 | Yahav et al. | |
| 8,493,141 B2 | 7/2013 | Khlat et al. | |
| 8,519,788 B2 | 8/2013 | Khlat | |
| 8,588,713 B2 | 11/2013 | Khlat | |
| 8,718,188 B2 | 5/2014 | Balteanu et al. | |
| 8,723,492 B2 | 5/2014 | Korzeniowski | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,942,651 B2 | 1/2015 | Jones | |
| 8,947,161 B2 | 2/2015 | Khlat et al. | |
| 8,989,682 B2 | 3/2015 | Ripley et al. | |
| 9,018,921 B2 | 4/2015 | Gurlahosur | |
| 9,020,451 B2 | 4/2015 | Khlat | |
| 9,020,453 B2 | 4/2015 | Briffa et al. | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,172,303 B2 * | 10/2015 | Vasadi .................. | H02M 3/158 |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,362,868 B2 | 6/2016 | Al-Qaq et al. | |
| 9,377,797 B2 | 6/2016 | Kay et al. | |
| 9,379,667 B2 | 6/2016 | Khlat et al. | |
| 9,445,371 B2 | 9/2016 | Khesbak et al. | |
| 9,491,314 B2 | 11/2016 | Wimpenny | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,705,451 B2 | 7/2017 | Takenaka et al. | |
| 9,748,845 B1 | 8/2017 | Kotikalapoodi | |
| 9,768,731 B2 | 9/2017 | Perreault et al. | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,900,204 B2 | 2/2018 | Levesque et al. | |
| 9,923,520 B1 | 3/2018 | Abdelfattah et al. | |
| 10,003,416 B1 | 6/2018 | Lloyd | |
| 10,084,376 B2 * | 9/2018 | Lofthouse ............. | H02M 3/155 |
| 10,090,808 B1 | 10/2018 | Henzler et al. | |
| 10,090,809 B1 | 10/2018 | Khlat | |
| 10,097,145 B1 | 10/2018 | Khlat et al. | |
| 10,103,693 B2 | 10/2018 | Zhu et al. | |
| 10,110,169 B2 | 10/2018 | Khesbak et al. | |
| 10,116,470 B2 | 10/2018 | Gu et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,284,412 B2 | 5/2019 | Khlat et al. | |
| 10,291,126 B1 * | 5/2019 | Wei ....................... | H02M 3/158 |
| 10,291,181 B2 | 5/2019 | Kim et al. | |
| 10,326,408 B2 | 6/2019 | Khlat et al. | |
| 10,361,744 B2 | 7/2019 | Khlat | |
| 10,381,983 B2 | 8/2019 | Balteanu et al. | |
| 10,382,071 B2 | 8/2019 | Rozek et al. | |
| 10,439,557 B2 | 10/2019 | Khlat et al. | |
| 10,476,437 B2 | 11/2019 | Nag et al. | |
| 10,622,900 B1 * | 4/2020 | Wei ....................... | H02M 3/1584 |
| 10,680,556 B2 | 6/2020 | Khlat | |
| 10,756,675 B2 | 8/2020 | Leipold et al. | |
| 10,862,431 B1 | 12/2020 | Khlat | |
| 10,873,260 B2 * | 12/2020 | Yan ....................... | H02M 3/158 |
| 10,879,804 B2 | 12/2020 | Kim et al. | |
| 11,050,433 B1 | 6/2021 | Melanson et al. | |
| 11,121,684 B2 | 9/2021 | Henzler et al. | |
| 11,128,261 B2 | 9/2021 | Ranta et al. | |
| 11,637,531 B1 * | 4/2023 | Perreault ............... | H03F 1/0227 |
| | | | 330/297 |
| 11,848,564 B2 * | 12/2023 | Jung ...................... | H02J 50/12 |
| 2002/0021110 A1 * | 2/2002 | Nakagawa ............ | H02J 7/0048 |
| | | | 320/136 |
| 2002/0157069 A1 * | 10/2002 | Ogawa .................. | G06F 30/367 |
| | | | 716/115 |
| 2002/0167827 A1 | 11/2002 | Umeda et al. | |
| 2003/0107428 A1 | 6/2003 | Khouri et al. | |
| 2004/0201281 A1 * | 10/2004 | Ma ........................ | H02M 3/158 |
| | | | 307/38 |
| 2004/0266366 A1 | 12/2004 | Robinson et al. | |
| 2005/0088160 A1 * | 4/2005 | Tanaka .................. | H02M 3/158 |
| | | | 323/284 |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0028271 A1 | 2/2006 | Wilson | |
| 2006/0240786 A1 | 10/2006 | Liu | |
| 2007/0036212 A1 | 2/2007 | Leung et al. | |
| 2007/0052474 A1 | 3/2007 | Saito | |
| 2007/0053217 A1 * | 3/2007 | Darroman ............. | H02M 3/158 |
| | | | 363/62 |
| 2007/0258602 A1 | 11/2007 | Vepsalainen et al. | |
| 2007/0290748 A1 | 12/2007 | Woo et al. | |
| 2008/0116960 A1 | 5/2008 | Nakamura | |
| 2008/0231115 A1 * | 9/2008 | Cho ...................... | H02M 3/33561 |
| | | | 307/41 |
| 2008/0231358 A1 | 9/2008 | Maemura | |
| 2008/0239772 A1 * | 10/2008 | Oraw .................... | H02M 7/4837 |
| | | | 363/60 |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0019052 A1 * | 1/2010 | Yip ....................... | G05D 23/19 |
| | | | 236/91 C |
| 2010/0039321 A1 | 2/2010 | Abraham | |
| 2010/0283534 A1 | 11/2010 | Pierdomenico | |
| 2010/0308919 A1 | 12/2010 | Adamski et al. | |
| 2011/0068757 A1 * | 3/2011 | Xu ........................ | H02M 3/158 |
| | | | 323/271 |
| 2011/0074373 A1 | 3/2011 | Lin | |
| 2011/0136452 A1 | 6/2011 | Pratt et al. | |
| 2011/0148705 A1 | 6/2011 | Kenington | |
| 2011/0175681 A1 | 7/2011 | Inamori et al. | |

(56) References Cited

U.S. PATENT DOCUMENTS

| | | |
|---|---|---|
| 2011/0199156 A1 | 8/2011 | Hayakawa |
| 2011/0279179 A1 | 11/2011 | Vice |
| 2012/0062031 A1* | 3/2012 | Buthker ............... H02M 3/158 307/31 |
| 2012/0194274 A1 | 8/2012 | Fowers et al. |
| 2012/0200435 A1 | 8/2012 | Ngo et al. |
| 2012/0274134 A1* | 11/2012 | Gasparini ........... H02M 3/1584 307/31 |
| 2012/0281597 A1 | 11/2012 | Khlat et al. |
| 2012/0286576 A1* | 11/2012 | Jing ..................... H02M 3/158 307/43 |
| 2012/0299645 A1 | 11/2012 | Southcombe et al. |
| 2012/0299647 A1 | 11/2012 | Honjo et al. |
| 2012/0326691 A1* | 12/2012 | Kuan ................... H02M 3/158 323/299 |
| 2013/0021827 A1 | 1/2013 | Ye |
| 2013/0063118 A1* | 3/2013 | Nguyen ................ G11C 5/145 323/304 |
| 2013/0072139 A1 | 3/2013 | Kang et al. |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0147457 A1* | 6/2013 | Kim ..................... H02M 3/158 323/311 |
| 2013/0162233 A1 | 6/2013 | Marty |
| 2013/0176961 A1* | 7/2013 | Kanamarlapudi .... H04W 72/21 370/329 |
| 2013/0187711 A1 | 7/2013 | Goedken et al. |
| 2013/0200865 A1 | 8/2013 | Wimpenny |
| 2013/0207731 A1 | 8/2013 | Balteanu |
| 2013/0234513 A1* | 9/2013 | Bayer .................... H02M 3/07 307/31 |
| 2013/0234692 A1* | 9/2013 | Liang .................... G05F 3/30 323/304 |
| 2013/0271221 A1 | 10/2013 | Levesque et al. |
| 2013/0288612 A1 | 10/2013 | Afsahi et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0097820 A1* | 4/2014 | Miyamae ............... H02M 3/158 323/283 |
| 2014/0103995 A1 | 4/2014 | Langer |
| 2014/0145692 A1* | 5/2014 | Miyamae ............... H02M 3/158 323/271 |
| 2014/0155002 A1 | 6/2014 | Dakshinamurthy et al. |
| 2014/0169427 A1 | 6/2014 | Asensio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0145600 A1 | 5/2015 | Hur et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0302845 A1 | 10/2015 | Nakano et al. |
| 2015/0311791 A1* | 10/2015 | Tseng .................... H02M 3/158 323/271 |
| 2015/0326114 A1* | 11/2015 | Rolland ................. H02M 1/08 307/31 |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0141736 A1 | 5/2017 | Pratt et al. |
| 2017/0149240 A1* | 5/2017 | Wu ....................... H02M 3/158 |
| 2017/0187187 A1* | 6/2017 | Amin ................... H02M 3/1588 |
| 2017/0302183 A1 | 10/2017 | Young |
| 2017/0317913 A1 | 11/2017 | Kim et al. |
| 2017/0331433 A1 | 11/2017 | Khlat |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0123516 A1* | 5/2018 | Kim ....................... H03F 1/02 |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309409 A1 | 10/2018 | Khlat |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068051 A1* | 2/2019 | Yang .................... H02M 3/158 |
| 2019/0068234 A1 | 2/2019 | Khlat et al. |
| 2019/0097277 A1 | 3/2019 | Fukae |
| 2019/0103766 A1* | 4/2019 | Von Novak, III .... H02M 3/137 |
| 2019/0109566 A1 | 4/2019 | Folkmann et al. |
| 2019/0109613 A1 | 4/2019 | Khiat et al. |
| 2019/0181804 A1 | 6/2019 | Khlat |
| 2019/0199215 A1* | 6/2019 | Zhao ........................ G05F 1/62 |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0288645 A1 | 9/2019 | Nag et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0091878 A1 | 3/2020 | Maxim et al. |
| 2020/0106392 A1 | 4/2020 | Khlat et al. |
| 2020/0127608 A1 | 4/2020 | Khlat |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |

(56) References Cited

U.S. PATENT DOCUMENTS

| | | |
|---|---|---|
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0304020 A1* | 9/2020 | Lu .................. H02M 3/155 |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328677 A1* | 10/2020 | Amin ................ H02M 3/1582 |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0350866 A1 | 11/2020 | Pehlke |
| 2020/0350878 A1 | 11/2020 | Drogi et al. |
| 2020/0382061 A1 | 12/2020 | Khlat |
| 2020/0382066 A1 | 12/2020 | Khlat |
| 2021/0036596 A1* | 2/2021 | Jeon ..................... H02M 1/009 |
| 2021/0036604 A1 | 2/2021 | Khlat et al. |
| 2021/0075372 A1* | 3/2021 | Henzler ................ H03F 3/189 |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194437 A1 | 6/2021 | Stockert |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0257971 A1* | 8/2021 | Kim ..................... H03F 3/245 |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2022/0021348 A1 | 1/2022 | Philpott et al. |
| 2022/0094256 A1* | 3/2022 | Radhakrishnan ....... H02M 3/07 |
| 2022/0123698 A1 | 4/2022 | Goto et al. |
| 2022/0123744 A1 | 4/2022 | Khlat |
| 2022/0181974 A1* | 6/2022 | Liu ..................... H02M 3/155 |
| 2022/0224294 A1 | 7/2022 | Khlat et al. |
| 2022/0263474 A1 | 8/2022 | Khlat |
| 2022/0278651 A1 | 9/2022 | Khlat |
| 2022/0286094 A1 | 9/2022 | Granger-Jones et al. |
| 2022/0385239 A1 | 12/2022 | Khlat |
| 2022/0399861 A1 | 12/2022 | Khlat |
| 2023/0113677 A1* | 4/2023 | Boley ................. H02N 99/00 307/18 |

FOREIGN PATENT DOCUMENTS

| | | |
|---|---|---|
| CN | 104620509 A | 5/2015 |
| CN | 104954301 A | 9/2015 |
| CN | 105322894 A | 2/2016 |
| CN | 105680807 A | 6/2016 |
| CN | 105703716 A | 6/2016 |
| CN | 105721366 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 107980205 A | 5/2018 |
| CN | 108141184 A | 6/2018 |
| CN | 109150212 A | 1/2019 |
| DE | 102019220150 A1 | 6/2020 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Notice of Allowance for U.S. Appl. No. 16/122,611, filed Jan. 13, 2021, 8 pages.

Notice of Allowance for U.S. Appl. No. 16/284,023, filed Jan. 19, 2021, 7 pages.

Notice of Allowance for U.S. Appl. No. 16/416,812, filed Feb. 16, 2021, 8 pages.

Non-Final Office Action for U.S. Appl. No. 16/689,236, filed Mar. 2, 2021, 15 pages.

Notice of Allowance for U.S. Appl. No. 16/435,940, filed Dec. 21, 2020, 7 pages.

Notice of Allowance for U.S. Appl. No. 16/774,060, filed Feb. 3, 2021, 7 pages.

Notice of Allowance for U.S. Appl. No. 16/590,790, filed Jan. 27, 2021, 7 pages.

Notice of Allowance for U.S. Appl. No. 16/661,061, filed Feb. 10, 2021, 7 pages.

Notice of Allowance for U.S. Appl. No. 16/122,611, filed Apr. 1, 2021, 8 pages.

Non-Final Office Action for U.S. Appl. No. 16/582,471, filed Mar. 24, 2021, 11 pages.

Wan, F. et al., "Negative Group Delay Theory of a Four-Port RC-Network Feedback Operational Amplifier," IEEE Access, vol. 7, Jun. 13, 2019, IEEE, 13 pages.

Notice of Allowance for U.S. Appl. No. 16/689,236, filed Jun. 9, 2021, 7 pages.

Non-Final Office Action for U.S. Appl. No. 16/775,554, filed Jun. 14, 2021, 5 pages.

Notice of Allowance for U.S. Appl. No. 16/582,471, filed Jun. 22, 2021, 9 pages.

Non-Final Office Action for U.S. Appl. No. 16/597,952, filed May 26, 2021, 7 pages.

Notice of Allowance for U.S. Appl. No. 16/834,049, filed Jun. 24, 2021, 8 pages.

Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.

Ying, K. et al., "A Wideband Envelope Detector with Low Ripple and High Detection Speed," 2018 IEEE International Symposium on Circuits and Systems (ISCAS), May 27-30, 2018, IEEE, 5 pages.

Notice of Allowance for U.S. Appl. No. 17/011,313, filed Nov. 4, 2021, 8 pages.

Notice of Allowance for U.S. Appl. No. 16/582,471, filed Feb. 1, 2022, 9 pages.

Non-Final Office Action for U.S. Appl. No. 16/597,952, filed Nov. 10, 2021, 9 pages.

Quayle Action for U.S. Appl. No. 16/855,154, filed Oct. 25, 2021, 6 pages.

Non-Final Office Action for U.S. Appl. No. 16/807,575, filed Jan. 31, 2022, 12 pages.

International Search Report and Written Opinion for International Patent Application No. PCT/US2021/050892, mailed Jan. 5, 2022, 20 pages.

International Search Report and Written Opinion for International Patent Application No. PCT/US2021/052151, mailed Jan. 4, 2022, 16 pages.

International Search Report and Written Opinion for International Patent Application No. PCT/US2021/054141 mailed Jan. 25, 2022, 15 pages.

Notice of Allowance for U.S. Appl. No. 17/115,982, filed Nov. 12, 2021, 8 pages.

Non-Final Office Action for U.S. Appl. No. 17/126,561, filed Oct. 14, 2021, 6 pages.

Non-Final Office Action for U.S. Appl. No. 17/032,553, filed Mar. 21, 2022, 4 pages.

(56) References Cited

OTHER PUBLICATIONS

Non-Final Office Action for U.S. Appl. No. 17/073,764, filed Dec. 24, 2021, 22 pages.
International Search Report and Written Opinion for International Patent Application No. PCT/US2021/052830, mailed Jan. 24, 2022, 13 pages.
Notice of Allowance for U.S. Appl. No. 15/964,762, filed Mar. 18, 2019, 7 pages.
Non-Final Office Action for U.S. Appl. No. 16/263,316, filed Dec. 23, 2019, 10 pages.
Final Office Action for U.S. Appl. No. 16/263,316, filed May 13, 2020, 10 pages.
Non-Final Office Action for U.S. Appl. No. 16/263,316, filed Jul. 17, 2020, 4 pages.
Non-Final Office Action for U.S. Appl. No. 16/263,316, filed Nov. 24, 2020, 4 pages.
Notice of Allowance for U.S. Appl. No. 16/263,316, filed Mar. 30, 2021, 7 pages.
First Office Action for Chinese Patent Application No. 202010083654.0, mailed May 12, 2023, 17 pages.
Notification to Grant for Chinese Patent Application No. 202010097807.7, mailed Jul. 11, 2023, 14 pages.
Final Office Action for U.S. Appl. No. 16/807,575, filed May 4, 2022, 12 pages.
Advisory Action for U.S. Appl. No. 16/807,575, filed Jul. 28, 2022, 3 pages.
Notice of Allowance for U.S. Appl. No. 16/807,575, filed Aug. 19, 2022, 8 pages.
International Preliminary Report on Patentability for International Patent Application No. PCT/US2021/050892, mailed Oct. 24, 2022, 20 pages.
International Preliminary Report on Patentability for International Patent Application No. PCT/US2021/052151, mailed Oct. 13, 2022, 21 pages.
International Preliminary Report on Patentability for International Patent Application No. PCT/US2021/054141, mailed Sep. 29, 2022, 20 pages.
Notice of Allowance for U.S. Appl. No. 17/148,064, filed Aug. 18, 2022, 8 pages.
Non-Final Office Action for U.S. Appl. No. 17/146,765, filed Sep. 7, 2022, 10 pages.
Non-Final Office Action for U.S. Appl. No. 17/163,642, filed Aug. 17, 2022, 9 pages.
Final Office Action for U.S. Appl. No. 17/163,642, filed Nov. 25, 2022, 13 pages.
Non-Final Office Action for U.S. Appl. No. 14/836,634, filed May 16, 2016, 9 pages.
Non-Final Office Action for U.S. Appl. No. 14/868,890, filed Jul. 14, 2016, 13 pages.
Non-Final Office Action for U.S. Appl. No. 15/792,909, filed May 18, 2018, 13 pages.
Notice of Allowance for U.S. Appl. No. 15/459,449, filed Mar. 28, 2018, 7 pages.
Notice of Allowance for U.S. Appl. No. 15/723,460, filed Jul. 24, 2018, 8 pages.
Notice of Allowance for U.S. Appl. No. 15/704,131, filed Jul. 17, 2018, 7 pages.
Notice of Allowance for U.S. Appl. No. 15/728,202, filed Aug. 2, 2018, 7 pages.
Non-Final Office Action for U.S. Appl. No. 15/888,300, filed Aug. 28, 2018, 11 pages.
Notice of Allowance for U.S. Appl. No. 15/792,909, filed Dec. 19, 2018, 11 pages.
Notice of Allowance for U.S. Appl. No. 15/993,705, filed Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, filed May 2, 2019, 14 pages.
Non-Final Office Action for U.S. Appl. No. 15/986,948, filed Mar. 28, 2019, 8 pages.
Non-Final Office Action for U.S. Appl. No. 16/018,426, filed Apr. 11, 2019, 11 pages.
Supplemental Notice of Allowability for U.S. Appl. No. 15/902,244, filed Mar. 20, 2019, 6 pages.
Notice of Allowance for U.S. Appl. No. 15/902,244, filed Feb. 8, 2019, 8 pages.
Advisory Action for U.S. Appl. No. 15/888,300, filed Jun. 5, 2019, 3 pages.
Notice of Allowance for U.S. Appl. No. 15/984,566, filed May 21, 2019, 6 pages.
Notice of Allowance for U.S. Appl. No. 16/150,556, filed Jul. 29, 2019, 7 pages.
Non-Final Office Action for U.S. Appl. No. 15/888,300, filed Jun. 27, 2019, 17 pages.
Final Office Action for U.S. Appl. No. 15/986,948, filed Aug. 27, 2019, 9 pages.
Advisory Action for U.S. Appl. No. 15/986,948, filed Nov. 8, 2019, 3 pages.
Notice of Allowance for U.S. Appl. No. 15/986,948, filed Dec. 13, 2019, 7 pages.
Final Office Action for U.S. Appl. No. 16/018,426, filed Sep. 4, 2019, 12 pages.
Advisory Action for U.S. Appl. No. 16/018,426, filed Nov. 19, 2019, 3 pages.
Notice of Allowance for U.S. Appl. No. 16/180,887, filed Jan. 13, 2020, 8 pages.
Notice of Allowance for U.S. Appl. No. 15/888,300, filed Jan. 14, 2020, 11 pages.
Non-Final Office Action for U.S. Appl. No. 16/122,611, filed Mar. 11, 2020, 16 pages.
Corrected Notice of Allowability for U.S. Appl. No. 15/888,300, filed Feb. 25, 2020, 7 pages.
Notice of Allowance for U.S. Appl. No. 16/018,426, filed Mar. 31, 2020, 7 pages.
Non-Final Office Action for U.S. Appl. No. 16/174,535, filed Feb. 4, 2020, 7 pages.
Quayle Action for U.S. Appl. No. 16/354,234, filed Mar. 6, 2020, 8 pages.
Notice of Allowance for U.S. Appl. No. 16/354,234, filed Apr. 24, 2020, 9 pages.
Non-Final Office Action for U.S. Appl. No. 16/246,859, filed Apr. 28, 2020, 9 pages.
Corrected Notice of Allowability for U.S. Appl. No. 15/888,300, filed May 13, 2020, 7 pages.
Notice of Allowance for U.S. Appl. No. 16/155,127, filed Jun. 1, 2020, 8 pages.
Final Office Action for U.S. Appl. No. 16/174,535, filed Jul. 1, 2020, 7 pages.
Non-Final Office Action for U.S. Appl. No. 16/284,023, filed Jun. 24, 2020, 7 pages.
Non-Final Office Action for U.S. Appl. No. 16/435,940, filed Jul. 23, 2020, 6 pages.
Final Office Action for U.S. Appl. No. 15/888,300, filed Feb. 15, 2019, 15 pages.
Final Office Action for U.S. Appl. No. 16/122,611, filed Sep. 18, 2020, 17 pages.
Advisory Action for U.S. Appl. No. 16/174,535, filed Sep. 24, 2020, 3 pages.
Notice of Allowance for U.S. Appl. No. 16/174,535, filed Oct. 29, 2020, 7 pages.
Notice of Allowance for U.S. Appl. No. 16/246,859, filed Sep. 18, 2020, 8 pages.
Final Office Action for U.S. Appl. No. 16/284,023, filed Nov. 3, 2020, 7 pages.
Quayle Action for U.S. Appl. No. 16/421,905, filed Aug. 25, 2020, 5 pages.
Non-Final Office Action for U.S. Appl. No. 16/416,812, filed Oct. 16, 2020, 8 pages.
Non-Final Office Action for U.S. Appl. No. 16/514,051, filed Nov. 13, 2020, 9 pages.

(56) References Cited

OTHER PUBLICATIONS

Non-Final Office Action for U.S. Appl. No. 16/774,060, filed Aug. 17, 2020, 6 pages.
Notice of Allowance for U.S. Appl. No. 16/122,611, filed Dec. 1, 2020, 9 pages.
Notice of Allowance for U.S. Appl. No. 17/073,764, filed Aug. 23, 2023, 12 pages.
Examination Report for European Patent Application No. 21790723.7, mailed Mar. 7, 2024, 5 pages.
Notice of Allowance for U.S. Appl. No. 17/343,912, filed Mar. 4, 2024, 7 pages.
Non-Final Office Action for U.S. Appl. No. 17/331,996, filed Feb. 1, 2024, 9 pages.
Notice of Allowance for U.S. Appl. No. 17/331,996, filed Mar. 1, 2024, 8 pages.
Non-Final Office Action for U.S. Appl. No. 17/363,568, filed Nov. 9, 2023, 8 pages.
Decision to Grant for Chinese Patent Application No. 202010083654.0, mailed Sep. 11, 2023, 8 pages.
Intention to Grant for European Patent Application No. 21806074.7, mailed May 10, 2024, 27 pages.
Notice of Allowance for U.S. Appl. No. 17/363,568, filed Apr. 17, 2024, 6 pages.
Notice of Allowance for U.S. Appl. No. 17/331,996, filed Jun. 14, 2024, 9 pages.
Notice of Allowance for U.S. Appl. No. 17/351,560, filed Apr. 19, 2024, 8 pages.
International Search Report and Written Opinion for International Patent Application No. PCT/US2023/085103, mailed Apr. 26, 2024, 17 pages.
Notification to Grant for Chinese Patent Application No. 202010083654.0, mailed Nov. 9, 2023, 8 pages.
Notice of Allowance for U.S. Appl. No. 17/363,568, filed Jan. 3, 2024, 7 pages.
Non-Final Office Action for U.S. Appl. No. 17/343,912, filed Dec. 14, 2023, 6 pages.
Quayle Action for U.S. Appl. No. 17/351,560, filed Nov. 24, 2023, 7 pages.
Notice of Allowance for U.S. Appl. No. 17/351,560, filed Jan. 4, 2024, 7 pages.
Notice of Allowance for U.S. Appl. No. 17/163,642, filed Mar. 1, 2023, 10 pages.
Final Office Action for U.S. Appl. No. 17/032,553, filed Jul. 29, 2022, 6 pages.
Notice of Allowance for U.S. Appl. No. 17/032,553, filed Oct. 11, 2022, 7 pages.
Final Office Action for U.S. Appl. No. 17/073,764, filed Jun. 1, 2022, 22 pages.
Advisory Action for U.S. Appl. No. 17/073,764, filed Aug. 23, 2022, 3 pages.
Non-Final Office Action for U.S. Appl. No. 17/073,764, filed Sep. 30, 2022, 13 pages.
Final Office Action for U.S. Appl. No. 17/073,764, filed Mar. 3, 2023, 14 pages.
Advisory Action for U.S. Appl. No. 17/073,764, filed May 26, 2023, 3 pages.
Extended European Search Report for European Patent Application No. 22153526.3, mailed Jul. 13, 2022, 9 pages.
Written Opinion for International Patent Application No. PCT/US2021/052830, mailed Nov. 3, 2022, 7 pages.
International Preliminary Report on Patentability for International Patent Application No. PCT/US2021/052830, mailed Feb. 20, 2023, 21 pages.
Ma, Hongyan, "Application and implementation of envelope tracking technology in mobile terminal RF power amplifier," Computers and Telecommunications, Oct. 2017, 18 pages.
First Office Action for Chinese Patent Application No. 201910092452.X, mailed Jul. 31, 2024, 17 pages.
First Office Action for Chinese Patent Application No. 201910512645.6, mailed Jul. 3, 2024, 15 pages.
First Office Action for Chinese Patent Application No. 201911232472.9, mailed Jul. 23, 2024, 10 pages.
First Office Action for Chinese Patent Application No. 201911312703.7, mailed Jul. 16, 2024, 10 pages.
Corrected Notice of Allowability for U.S. Appl. No. 17/331,996, filed Aug. 1, 2024, 6 pages.
Non-Final Office Action for U.S. Appl. No. 17/579,796, filed Aug. 30, 2024, 6 pages.
Notice of Allowance for U.S. Appl. No. 17/363,568, filed Sep. 19, 2024, 6 pages.
Notice of Allowance for U.S. Appl. No. 18/039,805, mailed Sep. 26, 2024, 10 pages.
Corrected Notice of Allowability and Response to Rule 312 Communication for U.S. Appl. No. 18/039,805, mailed Nov. 21, 2024, 5 pages.

\* cited by examiner

POWER MANAGEMENT INTEGRATED CIRCUIT

RELATED APPLICATIONS

This application is a 35 USC 371 national phase filing of International Application No. PCT/US2021/052830, filed Sep. 30, 2021, which claims the benefit of provisional patent application Ser. No. 63/121,622, filed Dec. 4, 2020, the disclosures of which is hereby are incorporated herein by reference in their entireties.

FIELD OF THE DISCLOSURE

The present disclosure is related to a power management integrated circuit (PMIC).

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by such advanced wireless communication technologies as fifth-generation new-radio (5G-NR). To achieve higher data rates, a mobile communication device may employ a power amplifier(s) to amplify a radio frequency (RF) signal(s) (e.g., maintaining sufficient energy per bit) before transmission. Given that the power amplifier(s) requires a supply voltage(s) for operation, a power management integrated circuit (PMIC) is thus required to generate and provide the supply voltage(s) to the power amplifier(s).

Given that the PMIC often needs to concurrently generate multiple supply voltages for multiple power amplifiers, the PMIC typically includes multiple direct-current to direct-current (DC-DC) power inductors. As a result, the PMIC can claim a larger portion of precious real estate in the mobile communication device. Hence, it is desirable to reduce the number of DC-DC power inductors in the PMIC to help reduce footprint of the PMIC.

SUMMARY

Embodiments of the disclosure relate to a power management integrated circuit (PMIC). The PMIC is configured to generate multiple voltages during a voltage generation period(s). In embodiments disclosed herein, the voltage generation period(s) is divided into multiple voltage generation intervals. A voltage generation circuit is configured to generate and maintain a respective one of the voltages during a respective one of voltage generation intervals based on a reference voltage modulated for the respective one of the voltage generation intervals to thereby make the voltages concurrently available during the voltage generation period(s). Moreover, a voltage modulation circuit is configured to modulate the reference voltage in each of the voltage generation intervals based on a single direct-current to direct-current (DC-DC) power inductor. As a result, the PMIC can concurrently support multiple load circuits (e.g., power amplifiers) with significantly reduced footprint.

In one aspect, a PMIC is provided. The PMIC includes a voltage generation circuit configured to generate and maintain a number of voltages during at least one voltage generation period based on a reference voltage. The PMIC also includes a voltage modulation circuit configured to modulate the reference voltage during the at least one voltage generation period. The PMIC also includes a control circuit. The control circuit is configured to divide the at least one voltage generation period into a number of voltage generation intervals for generating the number of voltages, respectively. The control circuit is also configured to cause the voltage modulation circuit to modulate the reference voltage to a respective level during each of the number of voltage generation intervals. The control circuit is also configured to cause the voltage generation circuit to generate and maintain each of the number of voltages in a respective one of the number of voltage generation intervals based on the respective level of the reference voltage modulated during the respective one of the number of voltage generation intervals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to a power management integrated circuit (PMIC). The PMIC is configured to generate multiple voltages during a voltage generation period(s). In embodiments disclosed herein, the voltage generation period(s) is divided into multiple voltage generation intervals. A voltage generation circuit is configured to generate and maintain a respective one of the voltages during a respective one of voltage generation intervals based on a reference voltage modulated for the respective one of the voltage generation intervals to thereby make the voltages concurrently available during the voltage generation period(s). Moreover, a voltage modulation circuit is configured to modulate the reference voltage in each of the voltage generation intervals based on a single direct-current to direct-current (DC-DC) power inductor. As a result, the PMIC can concurrently support multiple load circuits (e.g., power amplifiers) with significantly reduced footprint.

Figure 1:
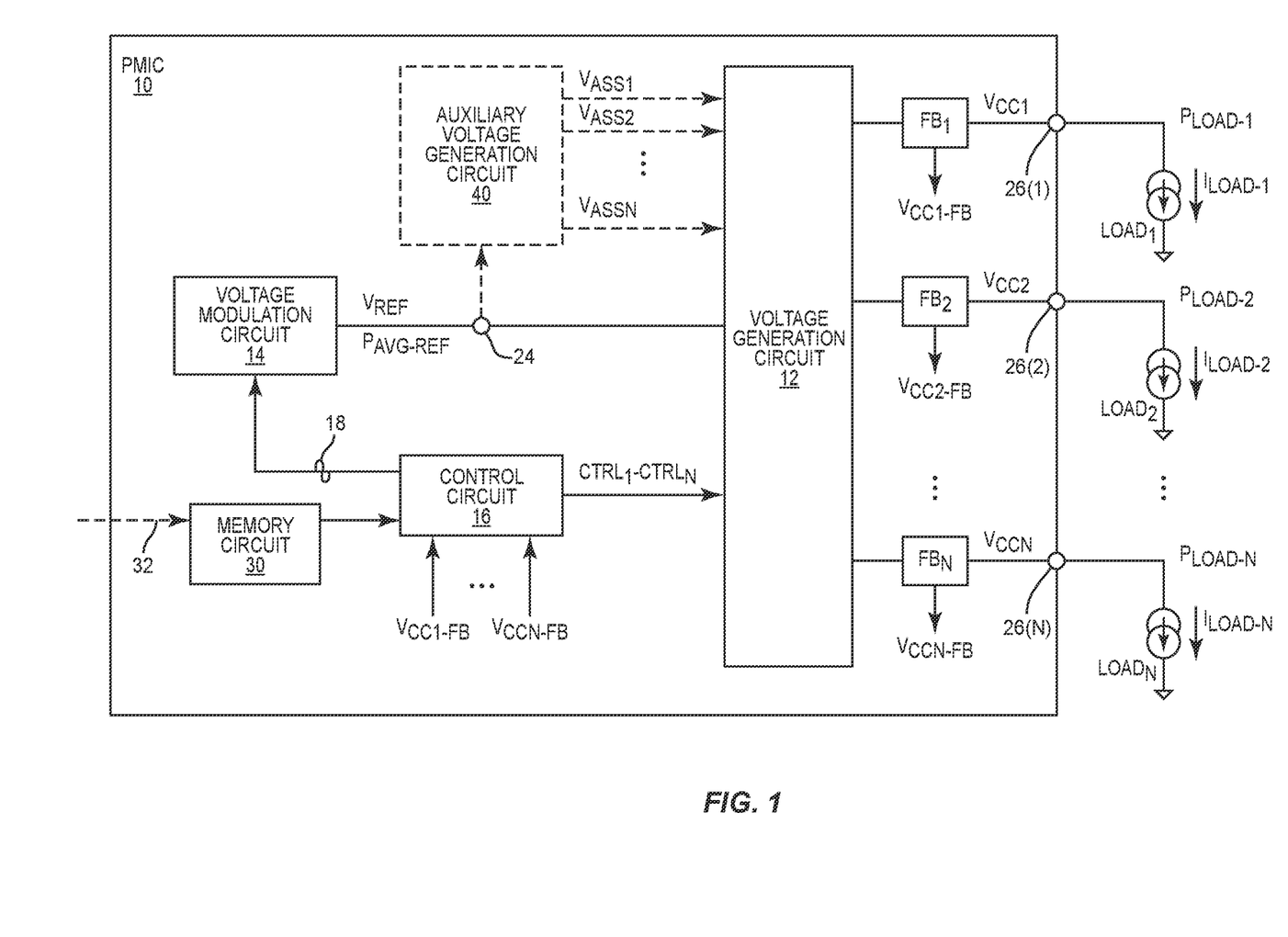
FIG. 1 is a schematic diagram of an exemplary power management integrated circuit (PMIC) configured according to embodiments of the present disclosure to concurrently generate multiple voltages without requiring multiple direct-current to direct-current (DC-DC) power inductors.
Figure 2:
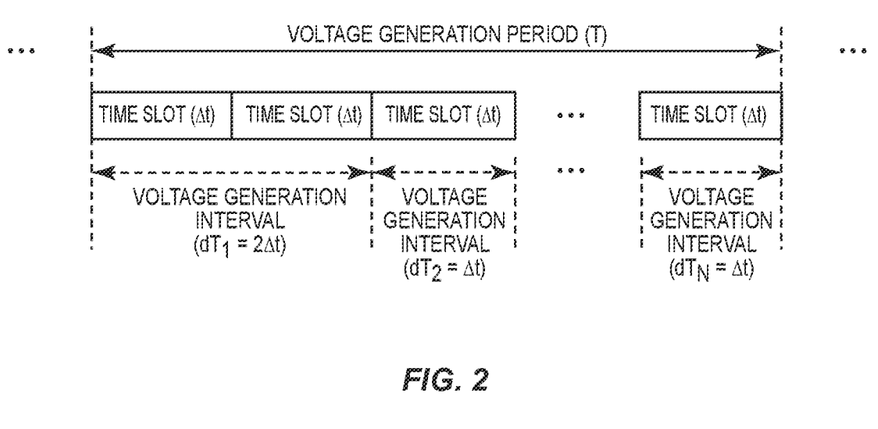
FIG. 2 is a schematic diagram providing an exemplary illustration of a voltage generation period during which the PMIC of FIG. 1 can be configured to concurrently generate the voltages.

In this regard, FIG. 1 is a schematic diagram of an exemplary PMIC configured according to embodiments of the present disclosure to generate multiple voltages $V_{CC1}$-$V_{CCN}$ without requiring multiple DC-DC power inductors. In an embodiment, the PMIC 10 is configured to generate and maintain the voltages $V_{CC1}$-$V_{CCN}$ during at least one voltage generation period (T) as illustrated in FIG. 2. FIG. 2 is a schematic diagram providing an exemplary illustration of the voltage generation period (T) during which the PMIC 10 of FIG. 1 can be configured to concurrently generate the voltages $V_{CC1}$-$V_{CCN}$.

In a non-limiting example, the voltage generation period (T) can be equally divided into multiple time slots ($\Delta t$). Accordingly, multiple voltage generation intervals $dT_1$-$dT_N$ can be further defined to each include a respective one or more of the time slots ($\Delta t$). Each of the voltage generation intervals $dT_1$-$dT_N$ can be longer if a respective one of the voltages $V_{CC1}$-$V_{CCN}$ is higher or be shorter if a respective one of the voltages $V_{CC1}$-$V_{CCN}$ is lower. For example, the voltage generation interval $dT_1$ can be configured to include two time slots ($2\Delta t$) for generating a higher voltage $V_{CC1}$. In contrast, the voltage generation intervals $dT_2$ and $dT_N$ are configured to each include one time slot ($\Delta t$) for generating lower voltages $V_{CC2}$ and $V_{CCN}$. Accordingly, the PMIC 10 can be configured to generate and maintain each of the voltages $V_{CC1}$-$V_{CCN}$ during a respective one of the voltage generation intervals $dT_1$-$dT_N$.

In this regard, the voltage generation intervals $dT_1$-$dT_N$ appear to be analogous to a time-division schedule for generating the voltages $V_{CC1}$-$V_{CCN}$. However, as discussed in detail below, the PMIC 10 can be further configured to maintain each of the voltages $V_{CC1}$-$V_{CCN}$ at a respective constant level during each of the voltage generation intervals $dT_1$-$dT_N$. As such, despite that the voltages $V_{CC1}$-$V_{CCN}$ are each generated in a time-division fashion, the PMIC 10 can nevertheless make the voltages $V_{CC1}$-$V_{CCN}$ concurrently available during the voltage generation period (T). Accordingly, the voltage generation period (T) should be determined by taking into consideration as to how long the PMIC 10 can maintain the voltages $V_{CC1}$-$V_{CCN}$ and to what degree a ripple can be tolerated in each of the voltages $V_{CC1}$-$V_{CC}$.

With reference back to FIG. 1, the PMIC 10 includes a voltage generation circuit 12 and a voltage modulation circuit 14. The voltage generation circuit 12 is configured to generate and maintain a respective one of the voltages $V_{CC1}$-$V_{CCN}$ during a respective one of voltage generation intervals $dT_1$-$dT_N$ based on a reference voltage $V_{REF}$ modulated for the respective one of the voltage generation intervals $dT_n$-$dT_N$. The voltage modulation circuit 14 is configured to modulate the reference voltage $V_{REF}$ in each of the voltage generation intervals $dT_1$-$dT_N$.

The PMIC 10 further includes a control circuit 16, which can be a field programmable gate array (FPGA), as an example. The control circuit 16 is configured to divide the voltage generation period (T) into the voltage generation intervals $dT_1$-$dT_N$. Accordingly, the control circuit 16 can provide a target signal 18 to cause the voltage modulation circuit 14 to modulate the reference voltage $V_{REF}$ to a respective level during each of the voltage generation intervals $dT_1$-$dT_N$. In addition, the control circuit 16 can assert multiple control voltages $CTRL_1$-$CTR_N$ to thereby cause the voltage generation circuit 12 to generate and maintain each of the voltages $V_{CC1}$-$V_{CCN}$ in a respective one of the voltage generation intervals $dT_1$-$dT_N$ based on the respective level of the reference voltage $V_{REF}$ modulated during the respective one of the voltage generation intervals $dT_1$-$dT_N$. Herein, asserting the control voltages $CTRL_1$-$CTR_N$ means increasing the control voltages $CTRL_1$-$CTR_N$ above respective threshold voltages. In contrast, de-asserting the control voltages $CTRL_1$-$CTR_N$ means decreasing the control voltages $CTRL_1$-$CTR_N$ below the respective threshold voltages.

Given that the voltages $V_{CC1}$-$V_{CCN}$ are each generated in a time-division fashion, the voltage modulation circuit 14 can also modulate the reference voltage $V_{REF}$ in the time-division fashion. As such, it is not necessary for the voltage modulation circuit 14 to concurrently modulate the reference voltage $V_{REF}$ in the voltage generation intervals $dT_1$-$dT_N$, thus making it possible for the voltage modulation circuit 14 to operate based on a single DC-DC power inductor to help reduce footprint of the PMIC 10.

Figure 3:
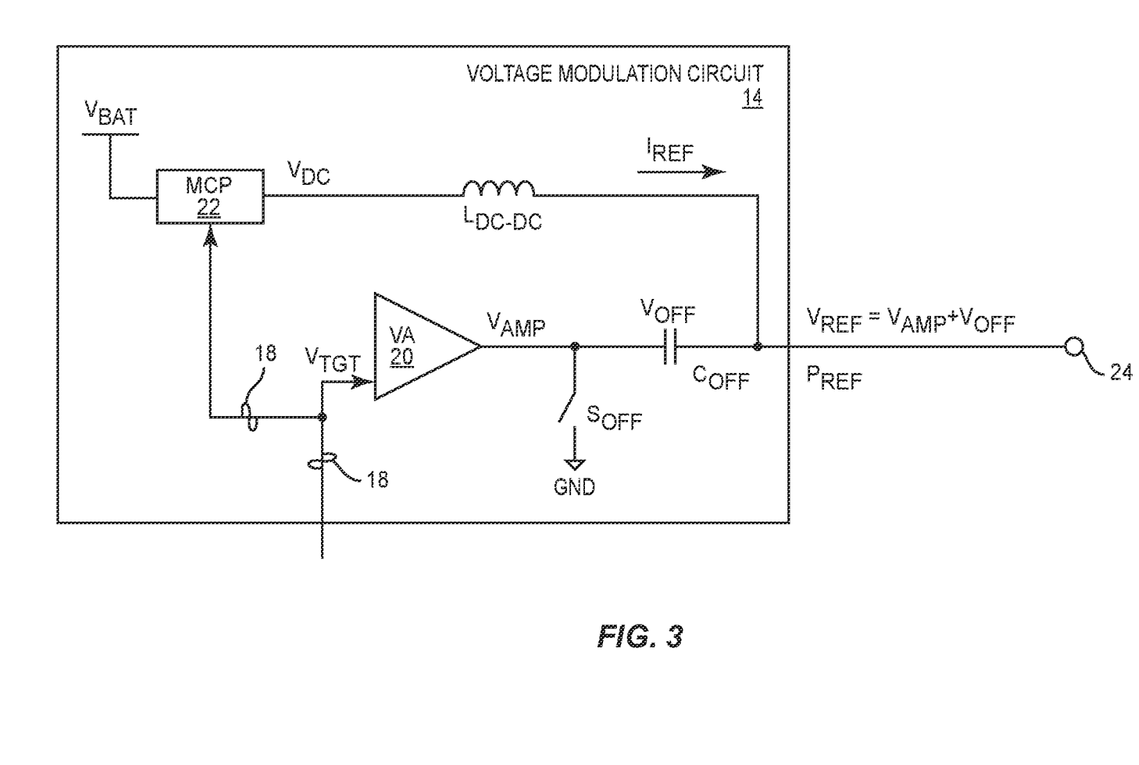
FIG. 3 is a schematic diagram providing an exemplary illustration of a voltage modulation circuit provided in the PMIC of FIG. 1 and configured according to an embodiment of the present disclosure to include a single DC-DC power inductor.

In this regard, FIG. 3 is a schematic diagram providing an exemplary illustration of the voltage modulation circuit 14 in the PMIC 10 of FIG. 1 configured according to an embodiment of the present disclosure to modulate the reference voltage $V_{REF}$ based on a single DC-DC power inductor $L_{DC\text{-}DC}$. Common elements between FIGS. 1 and 3 are shown therein with common element numbers and will not be re-described herein.

In a non-limiting example, the voltage modulation circuit 14 includes a voltage amplifier 20 (denoted as "VA"), an offset capacitor $C_{OFF}$, a multi-level charge pump (MCP) 22, the DC-DC power inductor $L_{DC\text{-}DC}$, and a switch $S_{OFF}$. The voltage amplifier 20 is configured to generate an initial reference voltage VAMP based on a target voltage $V_{TGT}$, which is received as part of the target signal 18. The offset capacitor $C_{OFF}$ is configured to raise the initial reference voltage $V_{AMP}$ by an offset voltage $V_{OFF}$ to thereby generate the reference voltage $V_{REF}$ ($V_{REF}=V_{AMP}+V_{OFF}$) at a reference node 24. In this regard, the voltage amplifier and the offset capacitor $C_{OFF}$ are collectively responsible for modulating the reference voltage $V_{REF}$ in each of the voltage generation intervals $dT_1$-$dT_N$. Notably, by using the offset capacitor $C_{OFF}$ to raise the initial reference voltage $V_{AMP}$, the initial reference voltage $V_{AMP}$ will be lower than the reference voltage $V_{REF}$, thus helping to improve efficiency of the voltage amplifier 20.

The MCP 22 is configured to generate a DC voltage $V_{DC}$ as a function of a battery voltage $V_{BAT}$ and in accordance with a defined duty cycle. In a non-limiting example, the defined duty cycle can also be configured via the target signal 18. The DC-DC power inductor $L_{DC\text{-}DC}$-DC is configured to induce a reference current $I_{REF}$ based on the DC voltage $V_{DC}$ to thereby charge the offset capacitor $C_{OFF}$ to the offset voltage $V_{OFF}$. The switch $S_{OFF}$ may be closed when the offset capacitor $C_{OFF}$ is charged towards the offset voltage $V_{OFF}$ and opened when the offset capacitor $C_{OFF}$ is charged to the offset voltage $V_{OFF}$. In this regard, the offset voltage $V_{OFF}$ is said to be modulated by the reference current $I_{REF}$.

By modulating the reference voltage $V_{REF}$ and/or the reference current $I_{REF}$, the voltage modulation circuit 14 further modulates a reference power $P_{REF}$ ($P_{REF}=V_{REF}*I_{REF}$) at the reference node 24. In this regard, the voltage modulation circuit 14 may also be referred to as a power modulation circuit. In one embodiment, the reference current $I_{REF}$ can be so generated as a constant current during the voltage generation period (T). As such, the voltage modulation circuit 14 can modulate the reference power $P_{REF}$ by modulating the reference voltage $V_{REF}$.

With reference back to FIG. 1, the PMIC 10 can include multiple voltage outputs 26(1)-26(N), each coupled to a respective one of multiple load circuits $LOAD_1$-$LOAD_N$ (e.g., power amplifier circuits). The voltage generation circuit 12 is coupled to the voltage outputs 26(1)-26(N) and configured to concurrently provide the voltages $V_{CC1}$-$V_{CCN}$ to the voltage outputs 26(1)-26(N), respectively, during the voltage generation period (T). Notably, the load circuits $LOAD_1$-$LOAD_N$ can each act as a current source. As such, the load circuits $LOAD_1$-$LOAD_N$ can each induce a respective one of multiple load currents $I_{LOAD\text{-}1}$-$I_{LOADN}$ in response to receiving a respective one of the voltages $V_{CC1}$-$V_{CCN}$. Accordingly, the load circuits $LOAD_1$-$LOAD_N$ will each consume a respective one of multiple load powers $P_{LOAD\text{-}1}$-$P_{LOAD\text{-}N}$ ($P_{LOAD\text{-}i}=V_{CCi}*I_{LOAD\text{-}i}$, $1\leq i\leq N$).

Figure 4:
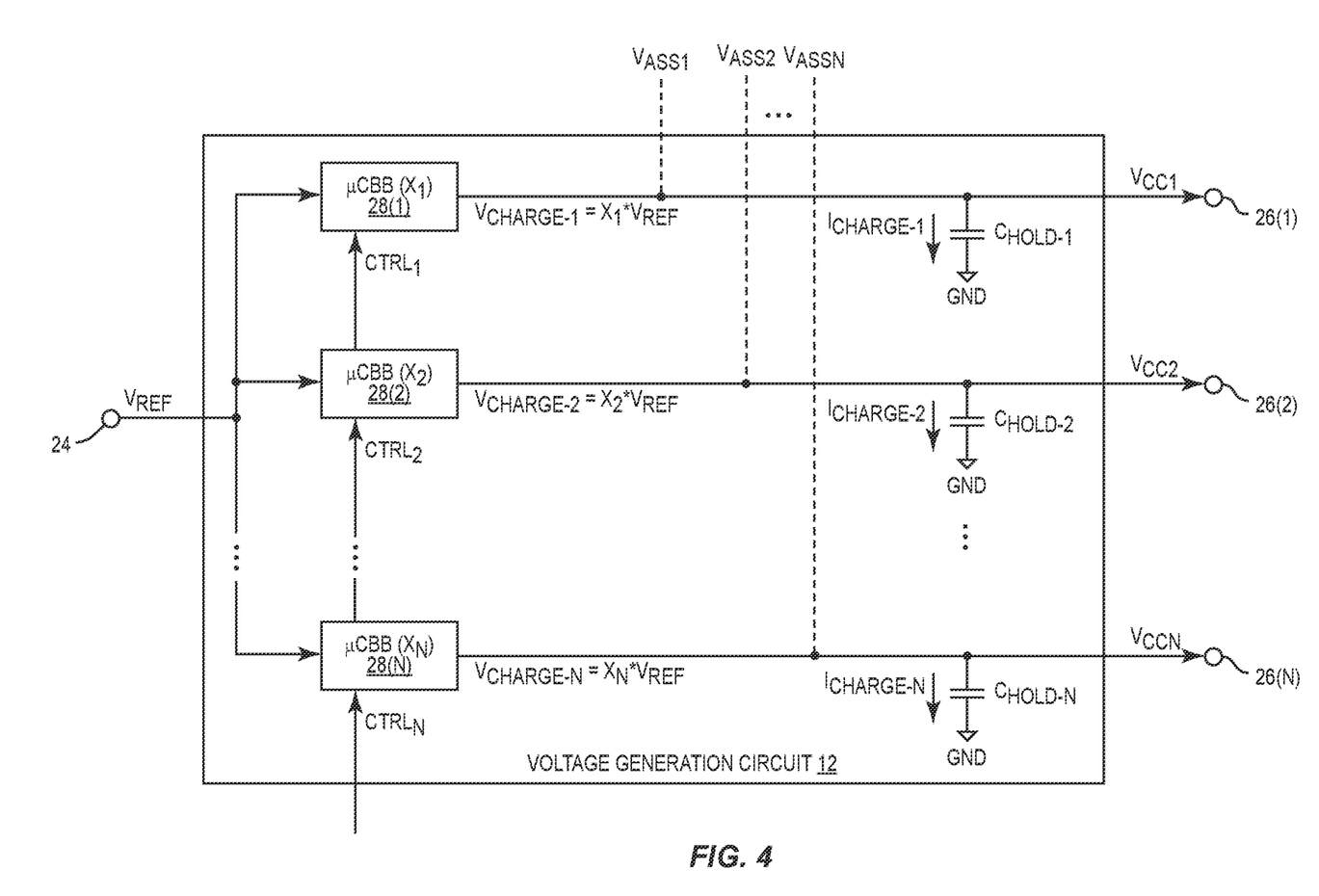
FIG. 4 is a schematic diagram providing exemplary illustration of a voltage generation circuit provided in the PMIC of FIG. 1 and configured according to an embodiment of the present disclosure to generate and maintain the voltages.

The voltage generation circuit 12 may be configured according to an embodiment illustrated in FIG. 4. FIG. 4 is a schematic diagram providing an exemplary illustration of the voltage generation circuit 12 in the PMIC 10 of FIG. 1 configured according to an embodiment of the present disclosure. Common elements between FIGS. 1 and 4 are shown therein with common element numbers and will not be re-described herein.

In a non-limiting example, the voltage generation circuit 12 includes multiple holding capacitors $C_{HOLD\text{-}1}$-$C_{HOLD\text{-}N}$ each coupled between a respective one of the voltage outputs 26(1)-26(N) and a ground (GND). The voltage generation circuit 12 also includes multiple switched capacitor-based voltage converters 28(1)-28(N) each configured to generate a respective one of multiple charging voltages $V_{CHARGE\text{-}1}$-$V_{CHARGE\text{-}N}$ in a respective one of the voltage generation intervals $dT_1$-$dT_N$ based on the reference voltage $V_{REF}$ modulated during the respective one of the voltage generation intervals $dT_1$-$dT_N$. Each of the charging voltages $V_{CHARGE\text{-}1}$-$V_{CHARGE\text{-}N}$ can cause a respective one of multiple charge currents $I_{CHARGE\text{-}1}$-$I_{CHARGE\text{-}N}$ to thereby charge a respective one of the holding capacitors $C_{HOLD\text{-}1}$-$C_{HOLD\text{-}N}$ to a respective one of the voltages $V_{CC1}$-$V_{CCN}$ during a respective one of the voltage generation intervals $dT_1$-$dT_N$.

In this regard, the holding capacitors $C_{HOLD\text{-}1}$-$C_{HOLD\text{-}N}$ are still being charged sequentially to the voltages $V_{CC1}$-$V_{CCN}$ during the voltage generation intervals $dT_1$-$dT_N$. However, each of the holding capacitors $C_{HOLD\text{-}1}$-$C_{HOLD\text{-}N}$ is so chosen to have a respective capacitance that can maintain a respective one of the voltages $V_{CC1}$-$V_{CCN}$ for up to the voltage generation period (T). As a result, the voltages $V_{CC1}$-$V_{CCN}$ can be simultaneously available at the voltage outputs 26(1)-26(N) during the voltage generation period (T). Hence, each of the voltage generation intervals $dT_1$-$dT_N$ must be long enough and each of the charge currents $I_{CHARGE\text{-}1}$-$I_{CHARGE\text{-}N}$ must be large enough to ensure that a respective one of the holding capacitors $C_{HOLD\text{-}1}$-$C_{HOLD\text{-}N}$ can be charged to a respective one of the voltages $V_{CC1}$-$V_{CCN}$ during a respective one of the voltage generation intervals $dT_1$-$dT_N$.

The switched capacitor-based voltage converters 28(1)-28(N) can be implemented based on any known switched capacitor-based voltage converter that does not include a DC-DC power inductor. In one embodiment, each of the switched capacitor-based voltage converters 28(1)-28(N) can be a switched capacitor-based buck voltage converter. In this regard, each of the switched capacitor-based voltage converters 28(1)-28(N) can operate based on a respective one of multiple conversion ratios $x_1$-$x_N$ that is less than or equal to 1 ($x_1$-$x_N \leq 1$). Accordingly, each of the switched capacitor-based voltage converters 28(1)-28(N) is configured to reduce or pass the reference voltage $V_{REF}$ modulated in a respective one of the voltage generation intervals $dT_1$-$dT_N$ to thereby generate a respective one of the charge voltages $V_{CHARGE\text{-}1}$-$V_{CHARGE\text{-}N}$ that is lower than or equal to the reference voltage $V_{REF}$.

In another embodiment, each of the switched capacitor-based voltage converters 28(1)-28(N) can be a switched capacitor-based boost voltage converter. In this regard, each of the switched capacitor-based voltage converters 28(1)-28(N) can operate based on a respective one of the conversion ratios $x_1$-$x_N$ that is greater than 1 ($x_1$-$x_N > 1$). Accordingly, each of the switched capacitor-based voltage converters 28(1)-28(N) is configured to boost the reference voltage $V_{REF}$ modulated in a respective one of the voltage generation intervals $dT_1$-$dT_N$ to thereby generate a respective one of the charge voltages $V_{CHARGE\text{-}1}$-$V_{CHARGE\text{-}N}$ that is higher than the reference voltage $V_{REF}$. Notably, by boosting the reference $V_{REF}$ to generate the charge voltages $V_{CHARGE\text{-}1}$-$V_{CHARGE\text{-}N}$, the voltage modulation circuit 14 can be configured to reduce the reference voltage $V_{REF}$ during each of the voltage generation intervals $dT_1$-$dT_N$, thus helping to improve efficiency of the voltage modulation circuit 14. In addition, the voltage modulation circuit 14 may also reduce the reference current $I_{REF}$ during each of the voltage generation intervals $dT_1$-$dT_N$, thus making it possible to reduce the size of the DC-DC power inductor $L_{DC\text{-}DC}$.

In one embodiment, the conversion ratios $x_1$-$x_N$ can be so determined to be different from one another. Accordingly, the switched capacitor-based voltage converters 28(1)-28(N) will each operate based on a different one of the conversion ratios $x_1$-$x_N$. In another embodiment, the conversion ratios $x_1$-$x_N$ can be so determined to be identical. Accordingly, the switched capacitor-based voltage converters 28(1)-28(N) will each operate based on a common conversion ratio. The conversion ratios $x_1$-$x_N$ can be determined by the control circuit 16 or preconfigured in the switched capacitor-based voltage converters 28(1)-28(N).

Figure 5A:
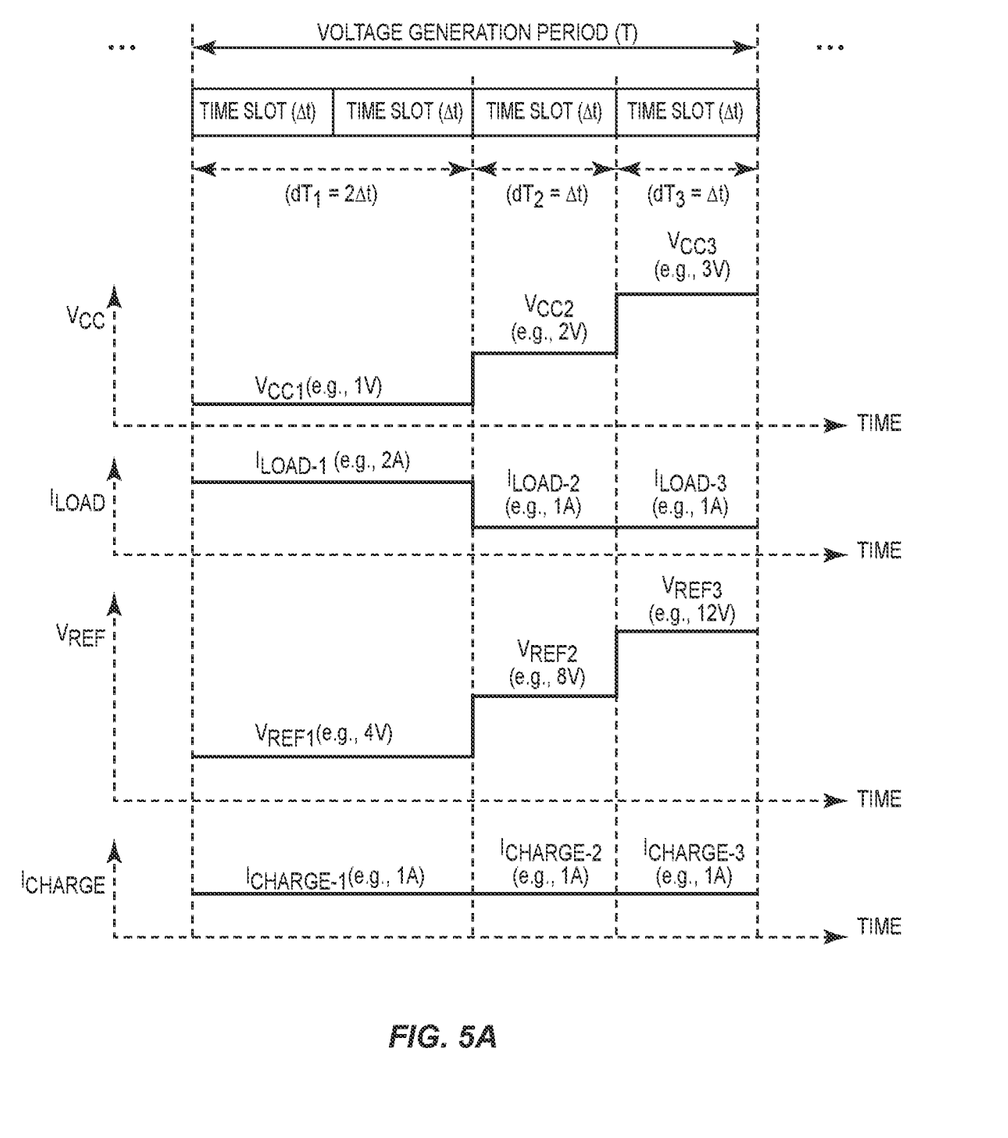
FIGS. 5A and 5B are signal diagrams illustrating exemplary operations of the PMIC of FIG. 1 in accordance with embodiments of the present disclosure.
Figure 5B:
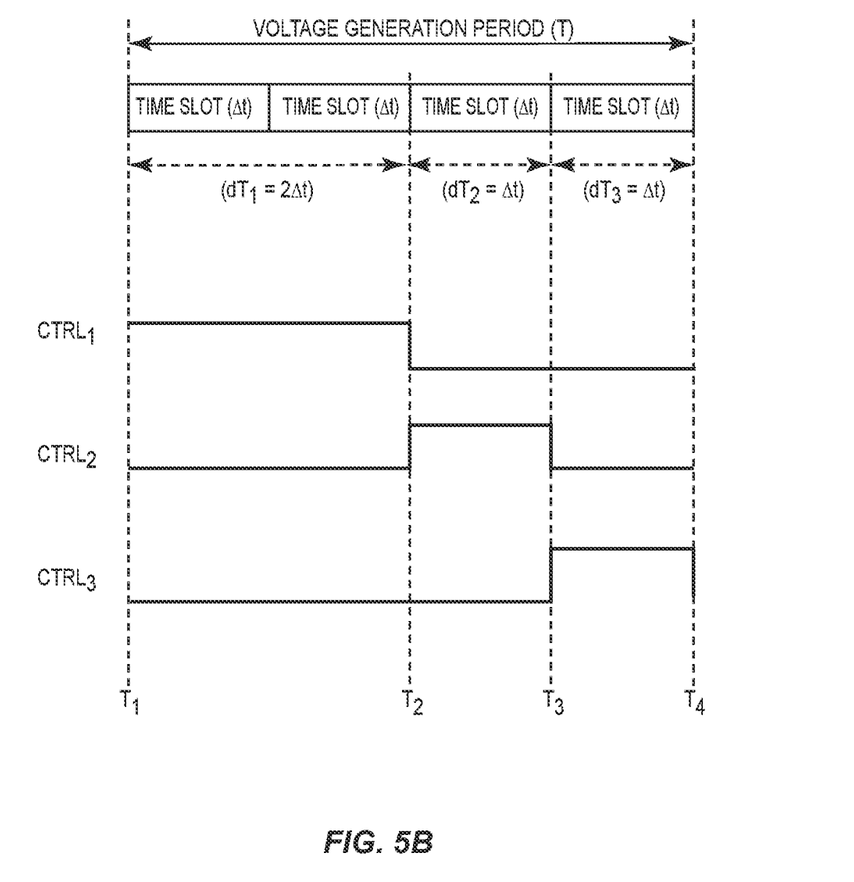

FIGS. 5A and 5B are signal diagrams illustrating exemplary operations of the PMIC of FIG. 1 in accordance with embodiments of the present disclosure. The illustrations discussed in FIGS. 5A and 5B are based on a set of assumptions. It should be appreciated that the assumptions are merely made for the convenience of illustration and shall not be considered as limiting by any means. Elements in FIGS. 1 and 4 are referenced in FIGS. 5A and 5B by respective element numbers and will not be re-described herein.

Herein, the voltage generation circuit 12 is assumed to generate the three voltages $V_{CC1}$, $V_{CC2}$, and $V_{CC3}$ for the three load circuits $LOAD_1$, $LOAD_2$, and $LOAD_3$, respectively. In this regard, it is assumed that there will be three load currents $I_{LOAD\text{-}1}$, $I_{LOAD\text{-}2}$, and $I_{LOAD\text{-}3}$ flowing through the load circuits $LOAD_1$, $LOAD_2$, and $LOAD_3$, respectively.

The voltage generation circuit 12 is also assumed to include the three switched capacitor-based voltage converters 28(1), 28(2), and 28(3) (represented by 28(N)) and the three holding capacitors $C_{HOLD\text{-}1}$, $C_{HOLD\text{-}2}$, and $C_{HOLD\text{-}3}$. The holding capacitors $C_{HOLD\text{-}1}$, $C_{HOLD\text{-}2}$, and $C_{HOLD\text{-}3}$ are assumed to be coupled to the three voltage outputs 26(1), 26(2), and 26(3), respectively. The voltage outputs 26(1), 26(2), and 26(3) are assumed to be coupled to three load circuits $LOAD_1$, $LOAD_2$, and $LOAD_3$, respectively.

Accordingly, the voltage generation period (T) is assumed to be divided into three voltage generation intervals $dT_1$, $dT_2$, and $dT_3$ ($T=dT_1+dT_2+dT_3$) for generating the voltages $V_{CC1}$, $V_{CC2}$, and $V_{CC3}$, respectively. In this example, the voltage generation period (T) is assumed to include four time slots ($T=4\Delta t$), which are divided unevenly among the voltage generation intervals $dT_1$, $dT_2$, and $dT_3$. The voltage generation interval $dT_1$ is assumed to include 2 time slots ($dT_1=2\Delta t=\frac{1}{2}T$), while the voltage generation intervals $dT_2$ and $dT_3$ are assumed to each include 1 time slot ($dT_2=dT_3=\Delta t=\frac{1}{4}T$).

The switched capacitor-based voltage converters 28(1), 28(2), and 28(3) are assumed to operate based on three conversion ratios $x_1$, $x_2$, and $x_3$ to convert the reference voltage $V_{REF}$ modulated during the voltage generation intervals $dT_1$, $dT_2$, and $dT_3$ into three charging voltages $V_{CHARGE\text{-}1}$, $V_{CHARGE\text{-}2}$, and $V_{CHARGE\text{-}3}$, respectively. The charging voltages $V_{CHARGE\text{-}1}$, $V_{CHARGE\text{-}2}$, and $V_{CHARGE\text{-}3}$, in turn, are assumed to cause three charging currents $I_{CHARGE\text{-}1}$, $I_{CHARGE\text{-}2}$, and $I_{CHARGE\text{-}3}$ for charging the holding capacitors $C_{HOLD\text{-}1}$, $C_{HOLD\text{-}2}$, and $C_{HOLD\text{-}3}$ during the voltage generation intervals $dT_1$, $dT_2$, and $dT_3$, respectively.

With reference to FIG. 5A, in a non-limiting example, the switched capacitor-based voltage converters 28(1), 28(2), and 28(3) are each configured to operate as a switched capacitor-based boost voltage converter based on a common conversion ratio x ($x=x_1=x_2=x_3$). The load currents $I_{LOAD\text{-}1}$, $I_{LOAD\text{-}2}$, and $I_{LOAD\text{-}3}$ as well as the voltages $V_{CC1}$, $V_{CC2}$, and $V_{CC3}$ are prestored in the PMIC 10 and thus considered known to the control circuit 16. In this example, it is further assumed that $V_{CC1}=1$ Volt (V), $V_{CC2}=2$ V, $V_{CC3}=3$ V, $I_{LOAD\text{-}1}=2$ Amp (A), $I_{LOAD\text{-}2}=1$ A, $I_{LOAD\text{-}3}=1$ A, and $x=4$.

The control circuit 16 may determine each of the charge currents $I_{CHARGE\text{-}1}$, $I_{CHARGE\text{-}2}$, and $I_{CHARGE\text{-}3}$ as a function of a respective one of the load currents $I_{LOAD\text{-}1}$, $I_{LOAD\text{-}2}$, and $I_{LOAD\text{-}3}$, as expressed in the equations below, for charging the holding capacitors $C_{HOLD\text{-}1}$, $C_{HOLD\text{-}2}$, and $C_{HOLD\text{-}3}$ during the voltage generation intervals $dT_1$, $dT_2$, and $dT_3$, respectively.

$$I_{CHARGE\text{-}1}=I_{LOAD\text{-}1}*(T/dT_1)=4\ A$$

$$I_{CHARGE\text{-}2}=I_{LOAD\text{-}2}*(T/dT_2)=4\ A$$

$$I_{CHARGE\text{-}3}=I_{LOAD\text{-}3}*(T/dT_3)=4\ A$$

The control circuit 16 can further determine the reference current $I_{REF}$ during the voltage generation intervals $dT_1$, $dT_2$, and $dT_3$ in accordance with the equations below.

$$I_{REF}\ \text{during}\ dT_1(I_{REF1})=I_{CHARGE\text{-}1}/X=4\ A/4=1\ A$$

$$I_{REF}\ \text{during}\ dT_2(I_{REF2})=I_{CHARGE\text{-}2}/X=4\ A/4=1\ A$$

$$I_{REF}\ \text{during}\ dT_3(I_{REF3})=I_{CHARGE\text{-}3}/X=4\ A/4=1\ A$$

In this regard, the reference current $I_{REF}$ is a constant current across the voltage generation intervals $dT_1$, $dT_2$, and $dT_3$. The control circuit 16 can further determine the reference voltage $V_{REF}$ during the voltage generation intervals $dT_1$, $dT_2$, and $dT_3$ in accordance with the equations below.

$$V_{REF}\ \text{during}\ dT_1(V_{REF1})=x*V_{CC1}=4*1\ V=4\ V$$

$$V_{REF}\ \text{during}\ dT_2(V_{REF2})=x*V_{CC2}=4*2\ V=8\ V$$

$$V_{REF}\ \text{during}\ dT_3(V_{REF3})=x*V_{CC3}=4*4\ V=12\ V$$

Accordingly, an average of the reference power $P_{REF}$ as modulated by the voltage modulation circuit 14 during the voltage generation period (T) can be expressed in the equation below.

$$AVG(P_{REF}) = (dT_1 * V_{REF1} * I_{REF1} + dT_2 * V_{REF2} * I_{REF2} + dT_3 * V_{REF3} * I_{REF3})/T$$

$$= (1/2T * 4V * 1A + 1/4T * 8V * 1A + 1/4T * 12V * 1A)/T = 7 \text{ Watt } (W)$$

Similarly, an average load power $AVG(P_{LOAD})$ consumed by the load circuits $LOAD_1$, $LOAD_2$, and $LOAD_3$ during the voltage generation period (T) can be expressed in the equation below.

$$AVG(P_{LOAD}) = (V_{CC1} * I_{LOAD-1} + V_{CC2} * I_{LOAD-2} + V_{CC3} * I_{LOAD3})$$

$$= 1V * 2A + 2V * 1A + 3V * 1A = 7 \text{ W}$$

With reference to FIG. 5B, the control circuit 16 may control each of the switched capacitor-based voltage converters 28(1), 28(2), and 28(3) via a respective one of three control voltages $CTRL_1$, $CTRL_2$, and $CTR_3$. The control circuit 16 may assert the control voltage $CTRL_1$ prior to or at time $T_1$ to cause the switched capacitor-based voltage converter 28(1) to charge the holding capacitor $C_{HOLD-1}$, assert the control voltage $CTRL_2$ prior to or at time $T_2$ to cause the switched capacitor-based voltage converter 28(2) to charge the holding capacitor $C_{HOLD-2}$, and assert the control voltage $CTRL_3$ prior to or at time $T_3$ to cause the switched capacitor-based voltage converter 28(3) to charge the holding capacitor $C_{HOLD-3}$. The control circuit 16 may be further configured to de-assert the control voltage $CTRL_1$ at or after time $T_2$, de-assert the control voltage $CTRL_2$ at or after time $T_3$, and de-assert the control voltage $CTRL_3$ at or after time $T_4$.

With reference back to FIG. 1, the PMIC 10 may be configured to include a memory circuit 30, which can be a random-access memory (RAM) circuit, a flash storage circuit, or a register bank, as an example. The memory circuit 30 may be programmed to store the voltages $V_{CC1}$-$V_{CCN}$ and the load currents $I_{LOAD-1}$-$I_{LOADN}$. The memory circuit 30 may be further programmed to store the conversion ratios $x_1$-$x_N$ of the switched capacitor-based voltage converters 28(1)-28(N), as shown in FIG. 4. In a non-limiting example, the memory circuit 30 can be programmed via a control bus 32, such as a radio frequency front-end (RFFE) bus or a single-wire serial bus, as an example. Accordingly, the control circuit 16 may retrieve the voltages $V_{CC1}$-$V_{CCN}$, the load currents $I_{LOAD-1}$-$I_{LOADN}$, and/or the conversion ratios $x_1$-$x_N$ from the memory circuit 30.

The PMIC may also include multiple feedback circuits $FB1$-$FB_N$, each configured to provide a respective one of a plurality of voltage feedbacks $V_{CC1}$-FB-$V_{CCN-FB}$ to the control circuit 16. Notably, each of the voltage feedbacks $V_{CC1-FB}$-$V_{CCN-FB}$ can be proportionally related to a respective one of the voltages $V_{CC1}$-$V_{CCN}$. Accordingly, the control circuit 16 may control the voltage modulation circuit 14 to adjust the reference voltage $V_{REF}$ during any of the voltage generation intervals $dT_1$-$dT_N$ based on a respective one of the voltage feedbacks $V_{CC1-FB}$-$V_{CCN-FB}$.

Figure 6:
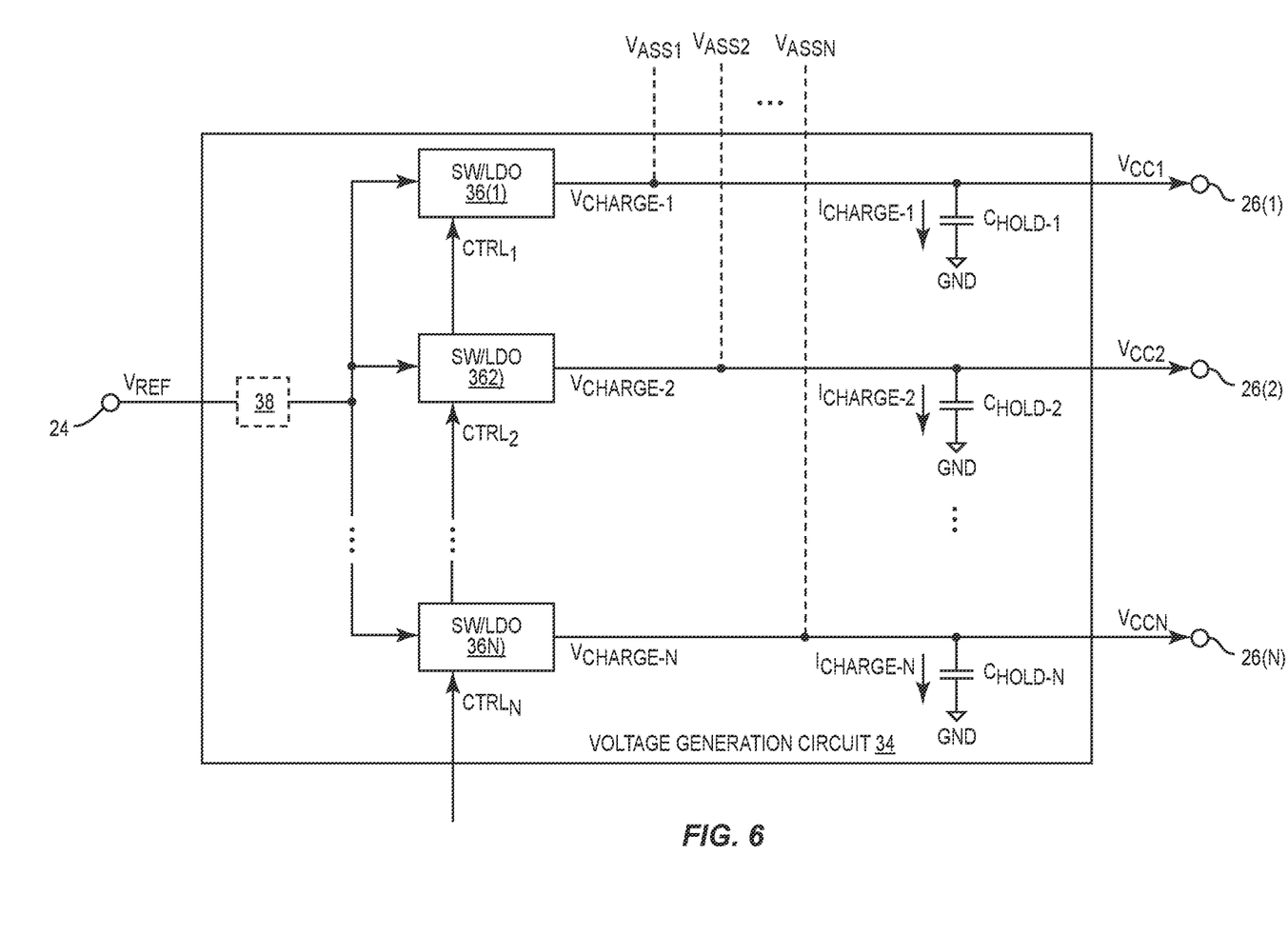
FIG. 6 is a schematic diagram providing an exemplary illustration of a voltage generation circuit provided in the PMIC of FIG. 1 and configured according to an alternative embodiment of the present disclosure.

Alternative to the voltage generation circuit 12 of FIG. 4, it is also possible to implement the voltage generation circuit 12 based on alternative configurations. In this regard, FIG. 6 is a schematic diagram of an exemplary voltage generation circuit 34 configured according to another embodiment of the present disclosure. Common elements between FIGS. 1, 4, and 6 are shown therein with common element numbers and will not be re-described herein.

The voltage generation circuit 34 includes multiple hybrid switch circuits 36(1)-36(N) (denoted as "SW/LDO"). Each of the hybrid switch circuits 36(1)-36(N) is coupled to a respective one of the holding capacitors $C_{HOLD-1}$-$C_{HOLD-N}$ and can operate either as a switch or a low dropout (LDO) regulator. Specifically, each the hybrid switch circuits 36(1)-36(N) can provide the reference voltage $V_{REF}$ as a respective one of the charging voltages $V_{CHARGE-1}$-$V_{CHARGE-N}$ directly to a respective one of the holding capacitors $C_{HOLD-1}$-$C_{HOLD-N}$ when operating as the switch. In contrast, when operating as the LDO regulator, each of the hybrid switch circuits 36(1)-36(N) regulates the reference voltage $V_{REF}$ before providing to a respective one of the holding capacitors $C_{HOLD-1}$-$C_{HOLD-N}$ as a respective one of the charging voltages $V_{CHARGE-1}$-$V_{CHARGE-N}$.

In one embodiment, the control circuit 16 may cause the voltage modulation circuit 14 to modulate the reference voltage $V_{REF}$ in each of the voltage generation intervals $dT_1$-$dT_N$ to be equal to a respective one of the voltages $V_{CC1}$-$V_{CCN}$. In this regard, the control circuit 16 may cause each of the hybrid switch circuits 36(1)-36(N) to operate as the switch.

In another embodiment, the control circuit 16 may cause the voltage modulation circuit to modulate the reference voltage in each of the voltage generation intervals $dT_1$-$dT_N$ to be higher than a respective one of the voltages $V_{CC1}$-$V_{CCN}$. In this regard, the control circuit 16 may cause each of the hybrid switch circuits 36(1)-36(N) to operate as the LDO regulator.

The voltage generation circuit 34 may also include a maximum voltage control circuit 38. The maximum voltage control circuit 38 may be configured to ensure that the reference voltage $V_{REF}$ is always greater than or equal to a respective one of the voltages $V_{CC1}$-$V_{CCN}$ during a respective one of the voltage generation intervals $dT_1$-$dT_N$ such that none of charging currents $I_{CHARGE-1}$-$I_{CHARGE-N}$ can flow back toward the voltage modulation circuit 14.

With reference back to FIG. 1, the PMIC 10 may also include an auxiliary voltage generation circuit 40 coupled to the voltage generation circuit 12. The auxiliary voltage generation circuit 40 may be configured generate multiple auxiliary voltages $V_{ASS1}$-$V_{ASSN}$ to assist in charging the holding capacitors $C_{HOLD-1}$-$C_{HOLD-N}$ during the voltage generation intervals $dT_1$-$dT_N$, respectively. Notably, the auxiliary voltages $V_{ASS1}$-$V_{ASSN}$ may each cause a respective one of the charging currents $I_{CHARGE-1}$-$I_{CHARGE-N}$ to increase, thus helping to speed up charging of a respective one of the holding capacitors $C_{HOLD-1}$-$C_{HOLD-N}$ during a respective one of the voltage generation intervals $dT_1$-$dT_N$. In a non-limiting example, the auxiliary voltage generation circuit 40 may generate each of the auxiliary voltages $V_{ASS1}$-$V_{ASSN}$ during a respective one of the voltage generation intervals $dT_1$-$dT_N$ as a function of the reference voltage $V_{REF}$ modulated during the respective one of the voltage generation intervals $dT_1$-$dT_N$.

Those skilled in the art will recognize improvements and modifications to the preferred embodiments of the present disclosure. All such improvements and modifications are considered within the scope of the concepts disclosed herein and the claims that follow.

What is claimed is:

1. A power management integrated circuit (PMIC) comprising:
   a voltage generation circuit configured to generate and maintain a plurality of voltages during at least one voltage generation period based on a reference voltage;
   a voltage modulation circuit comprising:
      a voltage amplifier configured to generate an initial reference voltage based on a target voltage; and
      an offset capacitor configured to raise the initial reference voltage by an offset voltage to generate the reference voltage during the at least one voltage generation period; and
   a control circuit configured to:
      divide the at least one voltage generation period into a plurality of voltage generation intervals for generating the plurality of voltages, respectively;
      cause the voltage modulation circuit to modulate the reference voltage to a respective level during each of the plurality of voltage generation intervals; and
      cause the voltage generation circuit to generate and maintain each of the plurality of voltages in a respective one of the plurality of voltage generation intervals based on the respective level of the reference voltage modulated during the respective one of the plurality of voltage generation intervals and maintain each of the plurality of voltages till an end of the at least one voltage generation period.

2. The PMIC of claim 1, wherein the voltage generation circuit is further configured to concurrently provide the plurality of voltages to a plurality of voltage outputs, respectively, during the at least one voltage generation period.

3. The PMIC of claim 2, wherein the voltage generation circuit comprises a plurality of holding capacitors each coupled between a respective one of the plurality of voltage outputs and a ground, the voltage generation circuit is further configured to charge each of the plurality of holding capacitors to a respective one of the plurality of voltages during a respective one of the plurality of voltage generation intervals.

4. The PMIC of claim 3, wherein the control circuit is further configured to:
   divide the at least one voltage generation period into a plurality of time slots; and
   determine the plurality of voltage generation intervals to each include a respective one or more of the plurality of time slots whereby the voltage generation circuit can charge a respective one of the plurality of holding capacitors to a respective one of the plurality of voltages within a respective one of the plurality of voltage generation intervals.

5. The PMIC of claim 3, wherein each of the plurality of holding capacitors is configured to maintain the respective one of the plurality of voltages at the respective one of the plurality of voltage outputs during the at least one voltage generation period to thereby cause the plurality of voltage outputs to output the plurality of voltages concurrently during the at least one voltage generation period.

6. The PMIC of claim 3, wherein the control circuit is further configured to:
   determine a plurality of load currents;
   determine a plurality of charging currents each as a function of a respective one of the plurality of load currents, respectively; and
   cause the voltage generation circuit to generate the plurality of charging currents to charge the plurality of holding capacitors to the plurality of voltages during the plurality of voltage generation intervals, respectively.

7. The PMIC of claim 6, further comprising a memory circuit configured to:
   store a respective value of each of the plurality of voltages; and
   store a respective value of each of the plurality of load currents.

8. The PMIC of claim 7, wherein the control circuit is further configured to retrieve the plurality of load currents and the plurality of voltages from the memory circuit.

9. The PMIC of claim 6, wherein the voltage generation circuit further comprises a plurality of switched capacitor-based voltage converters each coupled to a respective one of the plurality of holding capacitors, the plurality of switched capacitor-based voltage converters is configured to generate the plurality of charging currents to charge the plurality of holding capacitors, respectively.

10. The PMIC of claim 9, wherein each of the plurality of switched capacitor-based voltage converters is configured to operate based on a respective one of a plurality of conversion ratios to convert the reference voltage modulated in each of the plurality of voltage generation intervals into a respective one of a plurality of charging voltages to thereby cause a respective one of the plurality of charging currents to be generated.

11. The PMIC of claim 10, wherein the control circuit is further configured to cause the voltage modulation circuit to modulate the reference voltage in each of the plurality of voltage generation intervals as a function of a respective one of the plurality of conversion ratios and a respective one of the plurality of voltages.

12. The PMIC of claim 11, wherein the control circuit is further configured to:
   receive a plurality of voltage feedbacks each corresponding to a respective one of the plurality of voltages; and
   control the voltage modulation circuit to adjust the reference voltage in any of the plurality of voltage generation intervals based on a respective one of the plurality of voltage feedbacks.

13. The PMIC of claim 6, wherein the voltage generation circuit further comprises a plurality of hybrid switch circuits each coupled to a respective one of the plurality of holding capacitors, each of the plurality of hybrid switch circuits is configured to:
   operate as a switch to provide the reference voltage directly to a respective one of the plurality of holding capacitors; and
   operate as a low dropout (LDO) regulator to regulate the reference voltage before providing the reference voltage to the respective one of the plurality of holding capacitors.

14. The PMIC of claim 13, wherein the control circuit is further configured to:
   cause the voltage modulation circuit to modulate the reference voltage in each of the plurality of voltage generation intervals to be equal to a respective one of the plurality of voltages; and
   cause each of the plurality of hybrid switch circuits to operate as the switch.

15. The PMIC of claim 13, wherein the control circuit is further configured to:
  cause the voltage modulation circuit to modulate the reference voltage in each of the plurality of voltage generation intervals to be higher than a respective one of the plurality of voltages; and
  cause each of the plurality of hybrid switch circuits to operate as the LDO regulator.

16. The PMIC of claim 3, further comprising an auxiliary voltage generation circuit configured to generate a plurality of auxiliary voltages to assist in charging the plurality of holding capacitors in the plurality of voltage generation intervals, respectively.

17. The PMIC of claim 1, wherein the voltage modulation circuit further comprises:
  a multi-level charge pump (MCP) configured to generate a direct current (DC) voltage as a function of a battery voltage in accordance with a defined duty cycle; and
  a DC to DC (DC-DC) power inductor configured to induce a reference current based on the DC voltage to thereby charge the offset capacitor to the offset voltage.

18. The PMIC of claim 17, wherein the reference current is a constant current during the at least one voltage generation period.

19. The PMIC of claim 1, wherein each of the plurality of voltages is a constant voltage during the at least one voltage generation period.

* * * * *

UNITED STATES PATENT AND TRADEMARK OFFICE
CERTIFICATE OF CORRECTION

| | |
|---|---|
| PATENT NO. | : 12,265,442 B2 |
| APPLICATION NO. | : 18/254155 |
| DATED | : April 1, 2025 |
| INVENTOR(S) | : Nadim Khlat |

Page 1 of 1

It is certified that error appears in the above-identified patent and that said Letters Patent is hereby corrected as shown below:

In the Specification

In Column 5, Line 47, replace "the voltage amplifier" with --the voltage amplifier 20--.

In Column 8, Line 53, replace "$I_{REF}$ during $dT_1(I_{REF})=I_{CHARGE-1}/X=4$ A/4=1 A" with --$I_{REF}$ during $dT_1(I_{REF1})=I_{CHARGE-1}/x=4$ A/4=1 A--.

In Column 8, Line 55, replace "$I_{REF}$ during $dT_2(I_{REF2})=I_{CHARGE-2}/X=4$ A/4=1 A" with --$I_{REF}$ during $dT_2(I_{REF2})=I_{CHARGE-2}/x=4$ A/4=1 A--.

In Column 8, Line 57, replace "$I_{REF}$ during $dT_3(I_{REF3})=I_{CHARGE-3}/X=4$ A/4=1 A" with --$I_{REF}$ during $dT_3(I_{REF3})=I_{CHARGE-3}/x=4$ A/4=1 A--.

Signed and Sealed this
Sixth Day of May, 2025

Coke Morgan Stewart
*Acting Director of the United States Patent and Trademark Office*